(12) United States Patent
Lu

(10) Patent No.: US 11,587,795 B2
(45) Date of Patent: Feb. 21, 2023

(54) PLANARIZATION APPARATUS INCLUDING SUPERSTRATE CHUCK WITH BENDABLE PERIPHERY

(71) Applicant: CANON KABUSHIKI KAISHA, Tokyo (JP)

(72) Inventor: Xiaoming Lu, Cedar Park, TX (US)

(73) Assignee: Canon Kabushiki Kaisha, Tokyo (JP)

(*) Notice: Subject to any disclaimer, the term of this patent is extended or adjusted under 35 U.S.C. 154(b) by 52 days.

(21) Appl. No.: 17/035,212

(22) Filed: Sep. 28, 2020

(65) Prior Publication Data
US 2022/0102156 A1   Mar. 31, 2022

(51) Int. Cl.
*H01L 21/67* (2006.01)
*H01L 21/3105* (2006.01)
*H01L 21/02* (2006.01)

(52) U.S. Cl.
CPC .. *H01L 21/31058* (2013.01); *H01L 21/02118* (2013.01); *H01L 21/02282* (2013.01); *H01L 21/02348* (2013.01); *H01L 21/67092* (2013.01)

(58) Field of Classification Search
None
See application file for complete search history.

(56) References Cited

U.S. PATENT DOCUMENTS

| | | | | |
|---|---|---|---|---|
| 4,666,291 A * | 5/1987 | Taniguchi | ............... | G03F 7/703 355/76 |
| 4,788,577 A * | 11/1988 | Akiyama | ............ | G03F 7/70691 355/73 |
| 5,724,121 A | 3/1998 | Mckinley et al. | | |
| 6,809,802 B1 | 10/2004 | Tsukamoto et al. | | |
| 8,377,361 B2 | 2/2013 | Zhang et al. | | |
| 2006/0192928 A1* | 8/2006 | Kasumi | ................. | B82Y 10/00 355/72 |
| 2011/0308739 A1* | 12/2011 | McCutcheon | .... | H01L 21/68721 156/383 |
| 2014/0113433 A1* | 4/2014 | Nguyen | ................ | H01L 24/80 438/455 |
| 2015/0140149 A1 | 5/2015 | Lu et al. | | |
| 2020/0168580 A1* | 5/2020 | Zinner | .................... | H01L 24/80 |

* cited by examiner

*Primary Examiner* — Erik Kielin
(74) *Attorney, Agent, or Firm* — Canon U.S.A., Inc., IP Division

(57) ABSTRACT

A planarization apparatus, including a chuck having a first surface and a second surface at two opposing sides thereof. The chuck includes a first zone extending along a periphery of the chuck, a second zone at an inner portion of the chuck, the second zone being surrounded by the first zone; and a flexure connecting the first zone with the second zone. The first zone includes a first member extending along the first surface from the flexure and a first ring land protruding from the first member adjacent to the flexure.

18 Claims, 6 Drawing Sheets ize may further include a bonding land protruding in contact with the superstrate at the recessed peripheral portion. In one embodiment, the second zone includes a second ring land protruding from the first surface and in contact with the superstrate within a range of the mesa portion. The planarization apparatus may comprise a pressure source to apply a pressure to the second zone and a vacuum source to apply vacuum to the first zone and the second zone. The first zone further includes a second member extending along the second surface of the chuck, the first member and the second member define an empty space in the first zone. The first zone may further include a stopper protruding from the second member towards the first member.

One or more actuators may be installed at the first zone to generate a force to move the bending member about the flexure, and one or more sensors may be used to measure movement of the bending member. To firmly bond the bending zone with a peripheral portion of the superstrate, an electrostatic force generation source may be used to generate electrostatic force along the first surface at the first zone. Alternatively, the planarization apparatus may include one or more actuators connecting the first member and the second member at edges distal to the middle zone. The first member is spaced away from the middle zone with a gap. With the actuator, the first member may be bendable independently from the middle zone about the gap.

A planarization process is provided. In one embodiment, a superstrate is retained with a chuck, wherein the chuck includes a first zone and a second zone, the second zone being surrounded by the first zone and connected to the first zone at a flexure. The superstrate is advanced in contact with a formable material dispensed on a wafer. During spread of the formable material, the curvature of the superstrate may be controlled by applying pressure to the second zone and a movement of the first zone about the flexure towards the superstrate is driven and monitored to control a contact line moving velocity during spread. The planarization process may further comprise applying a vacuum to the first zone and generating an electrostatic force between the first zone and the superstrate. To separate the superstrate from the wafer, the vacuum applied to the first zone is maintained, and an initial crack is created along an edge of the superstrate and the wafer. The first zone is gradually moved towards a direction away from the superstrate, so as to separate an edge of the superstrate from an edge of the wafer. Move planarization head away from substrate while also gradually applying positive or negative pressure at a center portion of the superstrate to complete the separation.

A method of manufacturing an article is provided. In one embodiment, the method comprises the following steps. A superstrate is retained with a chuck. The chuck includes a first zone and a second zone, the second zone being surrounded by the first zone and connected to the first zone at a flexure. The superstrate is advanced towards a formable material formed on a wafer. A curvature of the superstrate is controlled for spreading the formable material by generating a curvature of the superstrate by applying pressure to the second zone and controlling a movement of the first zone about the flexure towards the superstrate. The formable material is solidified and the chuck is removed from the superstrate.

The method of manufacturing an article may further include separating the superstrate from the wafer by the following steps. The superstrate is retained with the chuck again. A vacuum is applied to the first zone of the chuck. An electrostatic force is generated between the first zone of the chuck and a peripheral portion of the superstrate. An initial

PLANARIZATION APPARATUS INCLUDING SUPERSTRATE CHUCK WITH BENDABLE PERIPHERY

BACKGROUND

Field of Art

The present disclosure relates to wafer processing, and more particularly, to the planarization process of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArF laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

SUMMARY

A planarization apparatus is provided. The planarization apparatus includes a chuck having a first surface and a second surface at two opposing sides thereof. The chuck includes a first zone extending along a periphery of the chuck, a second zone at an inner portion of the chuck, the second zone being surrounded by the first zone; and a flexure connecting the first zone with the second zone. The first zone includes a first member extending along the first surface from the flexure and a first ring land protruding from the first member adjacent to the flexure. The first zone may further comprise a bonding land protruding from the first member adjacent to the first ring land. The second zone may include a second ring land protruding from the first surface, such that the flexure is located between the first ring land and the second ring land. The chuck is configured to retain a superstrate at the first surface with the first ring in contact with the superstrate at location between a mesa portion and a recessed peripheral portion of the superstrate. The first separation crack is then created at an edge between the superstrate and the wafer. By gradually moving the first zone of the chuck away towards a direction away from the superstrate, an edge of the superstrate is gradually separated from an edge of the wafer. The superstrate is then gradually separated from the wafer by moving planarization head while also applying positive or negative pressure at a center portion of the superstrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
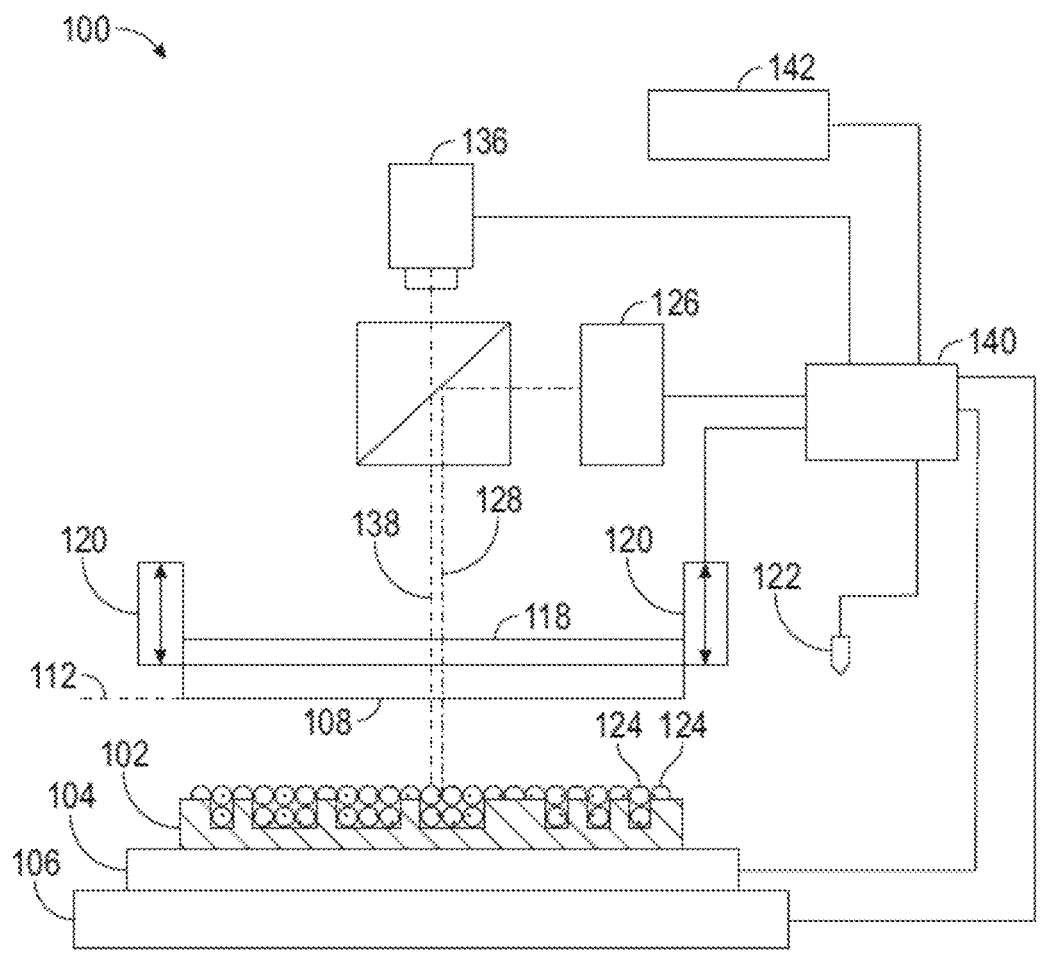
FIG. 1 is a diagram illustrating an apparatus.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates an apparatus 100 that, among other things, can be used to planarize a film on a substrate 102, for example, a wafer. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, $\theta$-, $\psi$, and $\varphi$-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 102. Surface 112 of superstrate 108 can include a planar contact surface. In another embodiment, the contact surface can include features that define any original pattern that forms the basis of a pattern to be formed on the substrate 102.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck may be readily transparent to UV light. The superstrate chuck 118 may include a system such as a zone based vacuum chuck, an actuator array, a pressure bladder, etc., which can apply a pressure differential to a back surface of the superstrate 108 to cause the superstrate to bend and deform. In one embodiment, the superstrate chuck 118 includes a zone based vacuum chuck which can apply a pressure differential to a back surface of the superstrate, causing the superstrate to bend and deform as further detailed herein.

The superstrate chuck 118 may be coupled to a head 120 which is a part of the positioning system. The head 120 may be movably coupled to a bridge (not shown). The head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, $\theta$-, $\psi$-, and $\varphi$-axis).

The apparatus 100 may further comprise a fluid dispenser 122. The fluid dispenser 122 may also be movably coupled to the bridge. In an embodiment, the fluid dispenser 122 and the head 120 share one or more of all positioning components. In an alternative embodiment, the fluid dispenser 122 and the head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 further comprises a curing system that includes a radiation source 126 that directs actinic energy, for example, UV radiation, along an exposure path 128. The head 120 and the substrate positioning state 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The apparatus 100 further comprises a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the superstrate chuck 118, the head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, the planarization head 120, the substrate position stage 106, or both vary a distance between the superstrate 108 and the substrate 102 to define a desired space (a bounded physical extent in three dimensions) that is filled with the formable material 124. For example, the head 120 may be moved toward the substrate and apply a force to the superstrate 108 such that the superstrate contacts and spreads droplets of the formable material 124 as further detailed herein.

Planarization Process

Figure 2A:
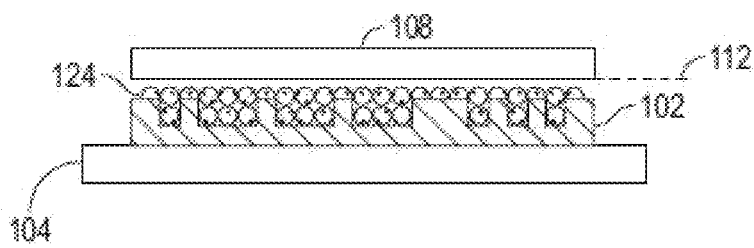
FIG. 2A to 2C illustrate a planarization process.
Figure 2B:
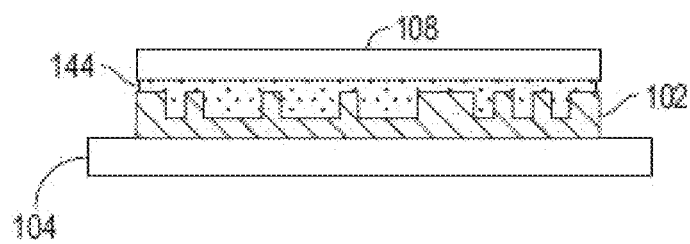
Figure 2C:
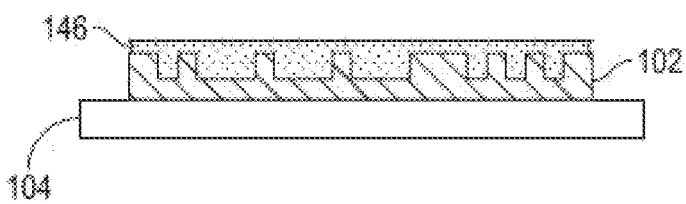

The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124.

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2C illustrates the cured planarized layer 146 on the substrate 102 after separation of the superstrate 108.

In an alternative embodiment where the contact surface of superstrate 108 include pattern features, a similar process as described above can be performed to form a patterned layer on substrate 102 (e.g., "whole wafer" patterning). Whole wafer processing is useful in semiconductor device fabrication as well biological or optical device production. Such whole wafer processing can further be adapted such that local film thickness can be tuned as a function of desirable local film thickness.

Figure 3:
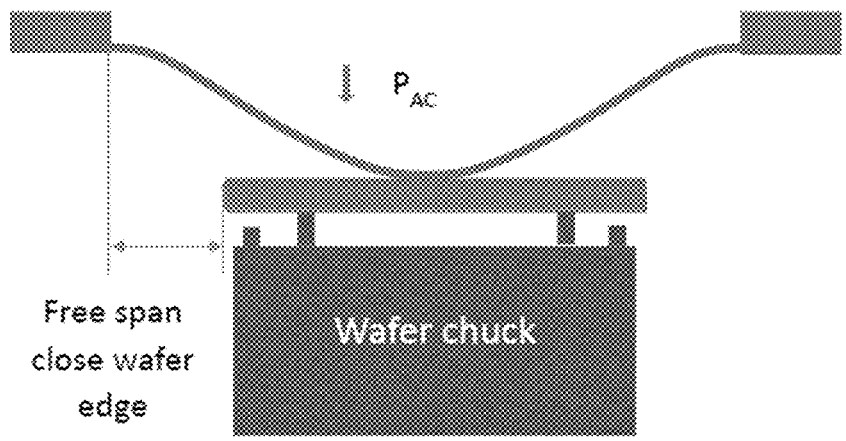
FIG. 3 illustrates free span of a superstrate during planarization spread.

During planarization spread, bending curvature of the superstrate may affect planarization throughput, and the contact line moving velocity of the formable material may have impact on residual layer thickness (RLT) uniformity. Planarization spread is a period of time during which formable material is 124 is being spread by capillary action and the curvature of the superstrate 108 to form an uncured planarization film. Before the superstrate 108 is in contact with the formable material 124 on the substrate 102, apply pressure at a middle zone 118M to bend the superstrate 108, then move the working surface 112 towards the substrate 102. The superstrate starts to contact formable material on the substrate from the center of the substrate, then the contact line may smoothly move to the edge of the substrate by using multi-variable control, such as controlling the contact force, and the pressure applied to the middle zone 118M. At the end of the planarization spread, the superstrate is in contact with the formable material over the entire substrate and the superstrate conforms to the shape of the substrate. Free span of the superstrate is one of the critical parameters to control the shape of the superstrate and may be used to control both the bending curvature and the contact line moving velocity during planarization spread. FIG. 3 shows the free span when there is sufficient difference in sizes between the superstrate and the wafer. By controlling free span of the superstrate, the bending curvature of the superstrate and the contact line moving velocity can be controlled during planarization spread. However, when a 300 mm size superstrate is in use, the insufficient difference between the sizes of the superstrate, the contact line moving is constrained and cannot be controlled by moving the planarization head position.

For separating the superstrate from the wafer, generation of an initial separation crack and a re-chucking of the superstrate are necessary requirements. The superstrate is re-chucked at the beginning of separation. With the current superstrate chuck, bending moment may be limited by free span and gap height and there is a conflict for gap height requirement between minimizing leakage during re-chuck and generating bending moment for vacuum.

Adaptive Superstrate Bending Control System

To resolve the issue of limited free span, an adaptive superstrate bending control system is provided. The system includes a superstrate chuck mounted to a planarization head to retain or chuck the superstrate and a motion control system. The superstrate chuck may be divided into a center zone, a middle zone, and a bending zone concentrically arranged from a center to an edge of the superstrate chuck. The bending free span of the superstrate can be extended by firmly bonding the edge of the superstrate to the bending zone of the superstrate chuck. A full vacuum may be applied to the bending zone. The size can be significantly reduced by increasing chucking pressure generated by electrostatic adhesion (ESC) applied between the superstrate edge and the superstrate bending zone. The electrostatic adhesion can be controlled by voltage and other chucking variables. The bending moment of the superstrate is proportionally amplified with increase of free span. The motion control system includes actuators, sensors, flexure and superstrate edge chucking subsystem that can generate bending moment required for separation and bending curvature required for spread control near the edge of the superstrate. The structure of the adaptive superstrate bending control system will be described in more details with references to FIG. 4 to FIG. 6.

Figure 4A:
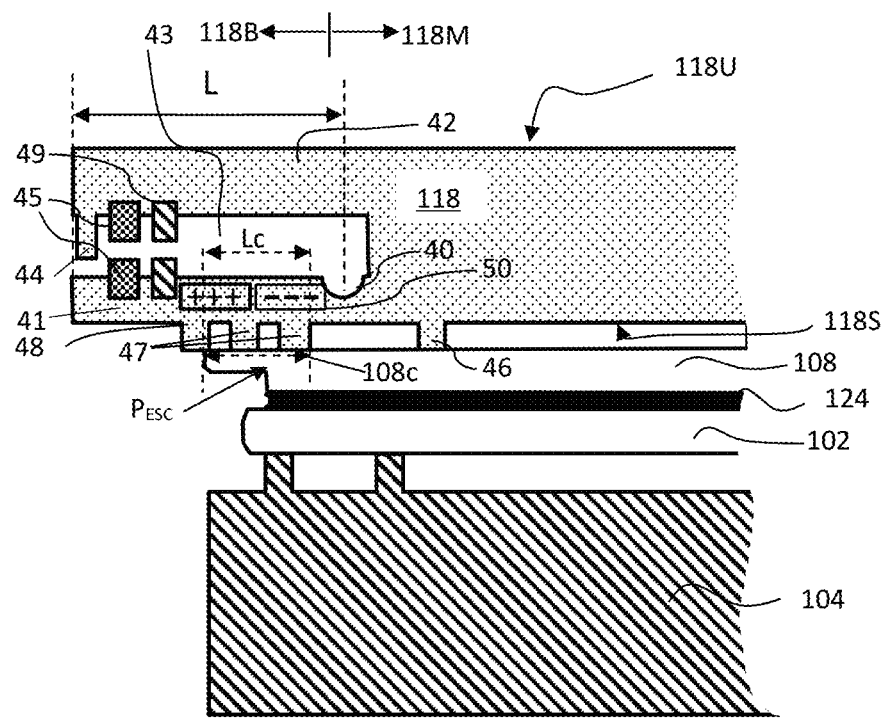
FIG. 4A illustrates adaptive superstrate bending control system applied to retain a superstrate during planarization process.
Figure 5:
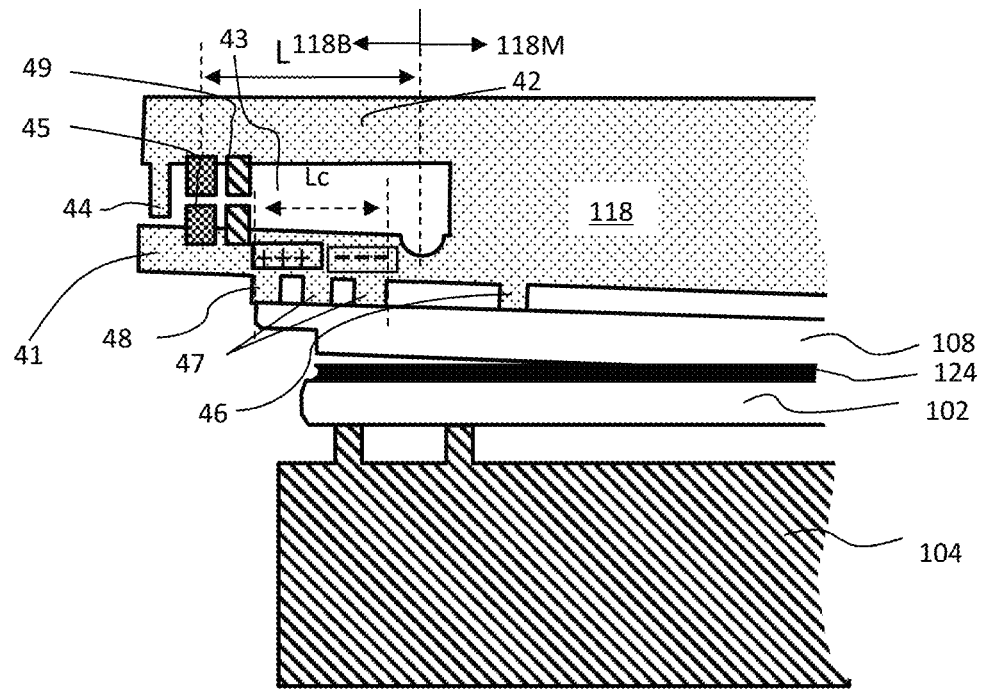
FIG. 5 illustrates the adaptive superstrate bending control system applied in planarization spread and planarization separation.

FIG. 4A illustrates an exemplary superstrate chuck structure in an adaptive edge bending control system. As shown, the superstrate chuck 118 is divided into at least a middle zone 118M and a bending zone 118B connected with each other. In the embodiment as shown in FIG. 4A, the superstrate chuck 118 includes a lower member, for example, a bending member 41, connected to the middle zone 118M. The superstrate chuck 118 has a support surface 118S with which a superstrate 108 is retained. The bending zone 118B includes the bending member 41 extending along the support surface 118S from a flexure 40. The flexure 40 functions as a pivot point about which the bending member 41 can be bent or deflected with respect to the middle zone 118M. The bending zone 118B further includes an upper member 42 extending along an upper surface 118U opposite to the support surface 118S of the superstrate chuck 118. An empty space 43 is defined between the bending member 41 and the upper member 42 to allow the bending member 41 to be bent or deflected towards the upper surface 118U as shown in FIG. 5. The upper member 42 includes ring stoppers or lands 44 extending towards the bending member 41 to avoid excessive upward deflection of the bending member 42. The length L of the bending member 118B may be about 20-60 mm. The length Lc is a distance between an outer edge of the superstrate 108 and an outer edge of an inner bonding land 47. The length Lc may be about 5-15 mm. The bending zone 118B also includes one or more actuators 45 and one or more sensors 49 and located in the upper member 42 and/or the bending member 41 to drive and sense/measure the motion of the bending member 41 relative to the upper member 42. The one or more actuators 45 may be voice coil motors, piezoelectric motors, linear motor, nut and screw motor, electrostatic attractors, vacuum actuators, magnetic actuators, etc. The one or more actuators 45 and the one or more sensors 49 may be spaced apart along a constant radial distance from a center of the superstrate chuck 118. The one or more sensors 49 may be a displacement sensor, a linear encoder, a laser interferometer, a capacitive displacement sensor, an eddy current sensor, a hall effect sensor, an inductive sensor, etc. The superstrate chuck 118 further includes one or more inner ring lands 46 protruding from contact surface 118S at the middle zone 118M and one or more inner bonding lands 47 protruding from the contact surface 118S at the bending zone 118B. The bending zone 118B further includes one or more outer bonding lands 48 protruding from the contact surface 118S. In an alternative embodiment, the bending member 41 is a flexible portion of the superstrate chuck 118, that has greater flexibility than the middle zone 118M of the superstrate chuck 118 and there is no flexure between the middle zone 118M and the bending zone 118B.

Figure 4B:
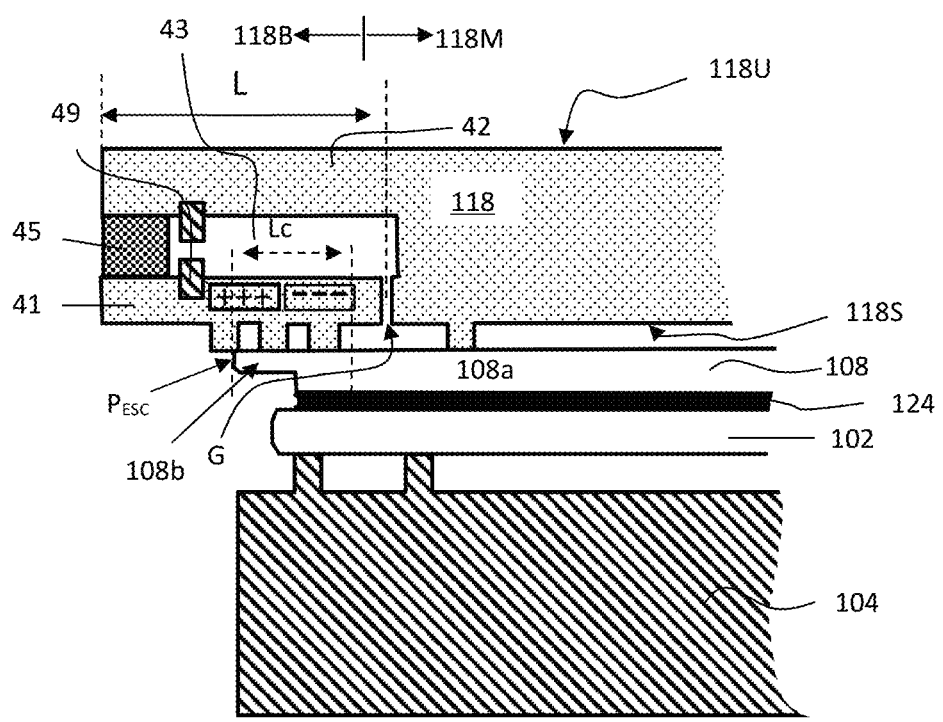
FIG. 4B shows another embodiment of an adaptive superstrate bending control system.

FIG. 4B illustrates another embodiment of the adaptive superstrate bending control system. As shown, the bending zone 118B includes an upper member 42 connected to and extends from the middle zone 118M along the upper surface 113. The bending zone 118B further includes a bending member 41 connected to the upper member 42 via an actuator 45. In this embodiment, the bending member 41 is not directly connected to the middle zone 118M. Instead, a gap is formed between the middle zone 118M and the bending member 42. Similar to the embodiment as shown in FIG. 4A, the bending member 42 can be controlled to bend or deflect with respect to the middle zone 118M about the gap G. The applicant has found that adjusting bending member 42 can improve the performance of the apparatus 100 by reducing vacuum leakage at an initial stage of the chucking and re-chucking process.

Planarization Spread and Separation

The superstrate 108 may include a mesa portion 108a on which a pattern is formed and a recessed peripheral portion 108b surrounding the mesa portion 108a. As shown in FIG. 4A, when the superstrate 108 is retained with the superstrate chuck 118, the one or more inner ring lands 46 are placed within the range of the mesa portion 108a, the one or more inner bonding lands 47 are placed at the edge of the mesa portion 108a, and a portion of the one or more outer bonding lands 48 may overlap with the peripheral portion 108b, while the other portion of the one or more outer bonding lands 48 may extend beyond the superstrate 108. During planarization spread, the bending zone 118B of the superstrate chuck 118 is firmly bonded to the peripheral portion 108b of the superstrate 108 by application of vacuum at the bending zone 118B and/or electrostatic force $P_{ESC}$ supplied by electrodes 50 between the peripheral portion 108b and the one or more outer bonding lands 48. A pressure is applied at the middle zone 118M to generate a desired curvature of the superstrate 108 while the vacuum is applied at the bending zone 118B. The curvature of the superstrate 108 may be about 0.05 m$^{-1}$ to about 0.5 m$^{-1}$, for example. To control the contact line moving velocity, the planarization head position is controlled, and the downward movement of the bending member 41 may be controlled by the actuator 45 and the sensor 49. Alternatively, the superstrate 108 does not include a mesa, and when the superstrate 108 is retained with the superstrate chuck 118, a portion of the one or more outer bonding lands 48 may overlap with an edge of the superstrate, while the other portion of the one or more outer bonding lands 48 may extend beyond the edge of the superstrate 108, the one or more inner bonding lands 47 are placed near an edge of the superstrate 108, and the one or more inner ring lands 46 are placed closer to the center of the superstrate 108.

Figure 6:
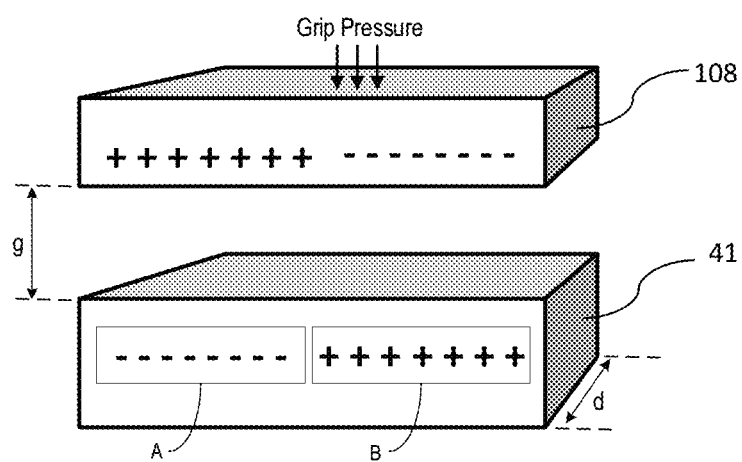
FIG. 6 shows the generation of electrostatic force between the chuck and the superstrate.

To separate the superstrate 108 from the substrate 102, the superstrate 108 is re-chucked with the superstrate chuck 118 by applying vacuum at the bending zone and may be center zone, and/or the middle zone. In an embodiment, re-chucking may include controlling a top surface of lands in the bending zone relative to top surface of lands in the middle zone and the center zone by using adaptive motion control system to minimize leakage between at least the bending zone lands and the superstrate edge. This will minimize leakage when vacuum is initially applied to the bending zone. Vacuum is then applied to the bending zone to retain the superstrate 108 to the superstrate chuck 118 and to bend a bending portion 108c of the superstrate 108. The actuator 45 may then generate a force to accurately control position of the bending member using a signal from the sensor 49 as feedback such that the one or more inner bonding lands 46 and the one or more outer boding lands 48 are in same plane with the peripheral portion 108b of superstrate 108 to minimize vacuum leakage between the bending member 41 and the peripheral portion 108b of the superstrate 108. The bending zone 1188 and the peripheral portion 108b of the superstrate 108 may be firmly bonded by application of vacuum applied to the bending zone 1188 and/or an electrostatic force generated between the bending member 41 and the upper surface of the peripheral portion 108b of the superstrate 108. The electrostatic force may be generated by applying a voltage V to the one or more outer bonding lands 48, such that charges on the surface of the superstrate 108 near the one or more outer bonding lands 48 will be re-distributed as shown in FIG. 6. The electrostatic force $P_{ESC}$ is a function of both the voltage V and the gap g. An initial separation crack may be generated, for example, along the edge of the stack of the superstrate 108 and the substrate 102 while the peripheral portion 108b is held with the superstrate chuck 118 by vacuum. The bending member 41 is gradually pulled away from the peripheral portion 108b of the superstrate 108 by the force generated by the actuator 45. Pressure is then gradually applied to a center area of the superstrate 108 for separation.

Method for Manufacturing an Article

Figure 7:
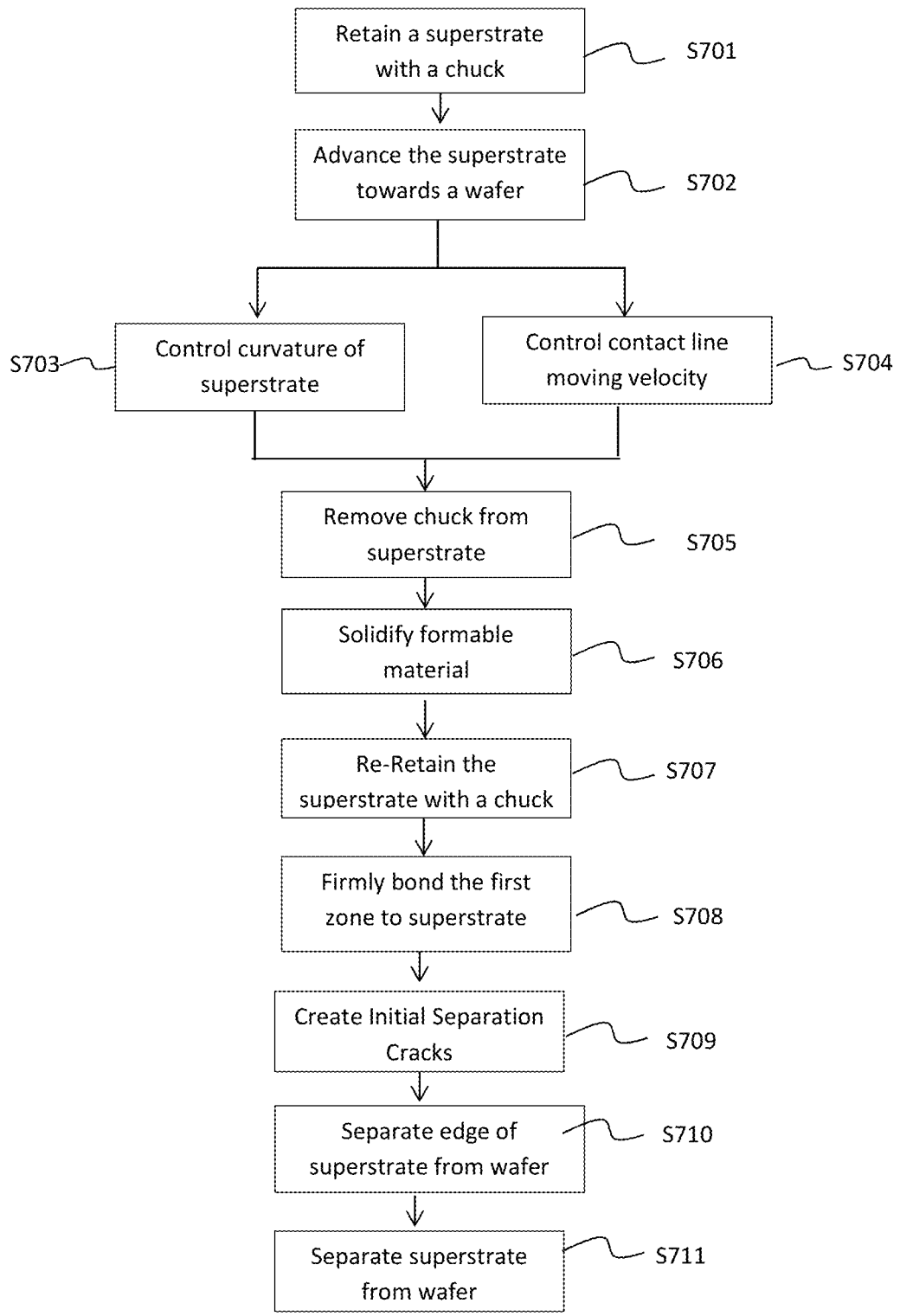
FIG. 7 shows a method of manufacturing an article.

FIG. 7 shows a process flow of manufacturing an article is provided in one embodiment. A superstrate is retained with a chuck in step S701. The chuck includes a first zone (the bending zone 1188 is an example of the first zone) and a second zone, the second zone being surrounded by the first zone and connected to the first zone at a flexure. Apply pressure in the second zone so as to bend the superstrate, then superstrate is advanced towards a formable material formed on a wafer in step S702. From an initial contact time to a second time when the contact line is close to substrate edge (about 10 mm from the substrate edge), a curvature of the superstrate is controlled for spreading the formable material by applying pressure to the first zone and the second zone in step S703 and a contact line moving velocity is controlled by controlling a movement of the planarization head. From the second time when the contact line is close to substrate edge to a third time when the contact line is at the substrate edge, the contact line moving velocity is controlled by moving the first zone about the flexure or other bending point towards the superstrate while maintaining the planarization head position in step S704. The superstrate 108 may be released from the superstrate chuck 118 in an optional step S705 by releasing the vacuum pressure and/or electrostatic force in the first zone and moving the superstrate chuck away from the superstrate. The formable material is solidified in step S706. In an embodiment, formable material continues to spread underneath the superstrate after step S705.

The method of manufacturing an article may further include separating the superstrate from the wafer by the following steps. If optional step S705 was performed then the superstrate is re-retained with the chuck again in optional step S707. Adaptive superstrate bending control system may be used to control inner bonding land 47 contacting with backside of superstrate 108, then a vacuum is applied to the first zone of the chuck, and/or an electrostatic force may be generated between the first zone of the chuck and a peripheral portion of the superstrate to firmly bond the first zone to the superstrate 108 in step S708. An initial separation crack is then created at an edge between the superstrate and the wafer in step S709. Adaptive superstrate bending control system may be used create the initial separation crack, alone or with the help of an external force, such as a push pin, jet of air, etc. By gradually moving the bending zone of the chuck away towards a direction away from the superstrate, an edge of the superstrate is gradually separated from an edge of the wafer in step S710. The superstrate is then gradually separated from the wafer by moving superstrate chuck by planarization head in step S711 while also applying positive or negative pressure at a center portion of the superstrate along with the superstrate away from the substrate with a cured planarization film.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A planarization apparatus, comprising:
   a superstrate chuck having a first surface and a second surface at two opposing sides thereof, the superstrate chuck including:
      a first zone extending along a periphery of the superstrate chuck; and
      a second zone at an inner portion of the superstrate chuck, the second zone being surrounded by the first zone;
   wherein the first zone includes:
      a first member extending along the first surface from an edge of the second zone, the first member is configured bendable independently from the second zone; and
      a first ring land protruding from the first member, and
   wherein the first zone further comprises a bonding land protruding from the first member adjacent to the first ring land.

2. The planarization apparatus of claim 1, further comprising an electrostatic force generation source configured to generate electrostatic force along the first surface at the first zone.

3. The planarization apparatus of claim 1, further comprising a flexure connecting a portion of the first zone with a portion of the second zone, wherein the second zone includes a second ring land protruding from the first surface, such that the flexure is located between the first ring land and the second ring land.

4. The planarization apparatus of claim 1, wherein the first member is spaced apart from the second zone with a gap, and the first member is bendable about the gap.

5. The planarization apparatus of claim 1, wherein the superstrate chuck is configured to retain a superstrate at the first surface.

6. The planarization apparatus of claim 5, wherein the first ring land is in contact with the superstrate at location between a mesa portion and a recessed peripheral portion of the superstrate.

7. The planarization apparatus of claim 6, wherein the first zone further includes a bonding land protruding in contact with the superstrate at the recessed peripheral portion.

8. The planarization apparatus of claim 5, wherein the second zone includes a second ring land protruding from the first surface and in contact with the superstrate within a range of the mesa portion.

9. The planarization apparatus of claim 1, further comprising a pressure source configured to apply a pressure to the second zone.

10. The planarization apparatus of claim 1, further comprising a vacuum source configured to apply vacuum to the first zone and the second zone.

11. The planarization apparatus of claim 1, wherein the first zone further includes a second member extending along the second surface of the superstrate chuck, the first member and the second member define an empty space in the first zone.

12. The planarization apparatus of claim 11, wherein the first zone further includes a stopper protruding from the second member towards the first member.

13. The planarization apparatus of claim 3, further comprising one or more actuators configured to generate a force to move the first member about the flexure.

14. The planarization apparatus of claim 13, wherein the one or more actuators mounted to the first member and a second member.

15. The planarization apparatus of claim 13, wherein the one or more actuators connect the first member with the second member at a side distal to the second zone.

16. The planarization apparatus of claim 1, further comprising one or more sensors configured to measure movement of the first member.

17. A planarization apparatus, comprising:
a superstrate chuck having a first surface and a second surface at two opposing sides thereof, the superstrate chuck including:
   a first zone extending along a periphery of the superstrate chuck; and
   a second zone at an inner portion of the superstrate chuck, the second zone being surrounded by the first zone;
wherein the first zone includes:
   a first member extending along the first surface from an edge of the second zone, the first member is configured bendable independently from the second zone; and
   a first ring land protruding from the first member,
wherein the first zone further includes a second member extending along the second surface of the superstrate chuck, the first member and the second member define an empty space in the first zone.

18. A planarization apparatus, comprising:
a superstrate chuck having a first surface and a second surface at two opposing sides thereof, the superstrate chuck including:
   a first zone extending along a periphery of the superstrate chuck; and
   a second zone at an inner portion of the superstrate chuck, the second zone being surrounded by the first zone;
wherein the first zone includes:
   a first member extending along the first surface from the periphery of the superstrate chuck, the first member is configured to be bendable relative to the periphery of the superstrate chuck;
   a first ring land protruding from the first member;
   a second ring land protruding from the first member;
   an upper member extending above the first member; and
   one or more additional lands extending from the upper member towards a back surface of the first member.

* * * * *